United States Patent [19]

Schiffman

[11] 4,151,040
[45] Apr. 24, 1979

[54] METHOD AND APPARATUS FOR TRANSFERRING A DESIGN TO A FLAT OR ARCUATE SURFACE

[75] Inventor: Murray M. Schiffman, Westport, Conn.

[73] Assignee: MBI, Inc., Westport, Conn.

[21] Appl. No.: 832,382

[22] Filed: Sep. 12, 1977

Related U.S. Application Data

[63] Continuation-in-part of Ser. No. 757,505, Jan. 7, 1977, Pat. No. 4,119,484, and Ser. No. 733,711, Oct. 18, 1976, Pat. No. 4,101,373, and Ser. No. 729,764, Oct. 5, 1976, Pat. No. 4,102,734.

[51] Int. Cl.² .................. C23F 1/02; G03B 27/32; G03B 21/00
[52] U.S. Cl. ..................................... 156/659; 355/66; 355/77
[58] Field of Search .................. 355/47, 64, 66, 67, 355/77; 96/27 R, 36, 36.2, 38.1; 156/659; 427/256, 282, 259, 272; 204/15

[56] References Cited

U.S. PATENT DOCUMENTS

| | | | |
|---|---|---|---|
| 3,238,909 | 3/1966 | Kendall | 355/47 X |
| 3,313,223 | 4/1967 | Frantzen | 96/36.2 |
| 3,377,915 | 4/1968 | Buckett | 353/79 |
| 3,428,503 | 2/1969 | Beckerle | 156/58 X |
| 3,649,394 | 3/1972 | Erickson | 96/38.2 X |
| 3,785,819 | 1/1974 | Barnes et al. | 96/27 R |

*Primary Examiner*—William A. Powell
*Attorney, Agent, or Firm*—Cooper, Dunham, Clark, Griffin & Moran

[57] ABSTRACT

Method and apparatus for transferring a design by projecting the design onto a flat or arcuate surface and etching and/or selective plating. The design is transferred to the image surface by passing light through a transparency, or by reflecting illuminating light from a surface, bearing the design in rectangular-coordinate form and formed into a cylinder and then redirecting the light such that the design is projected upon and received by corresponding areas of an image surface which is or has been photosensitized. The design appears on a flat image surface in a foreshortened circular form, and is adapted for subsequent formation into an arcuate surface bearing the design in undistorted form. The design also may be projected either directly, or from a flat image surface transparency, upon an arcuate image surface in undistorted form.

25 Claims, 10 Drawing Figures

U.S. Patent Apr. 24, 1979 Sheet 1 of 2 4,151,040
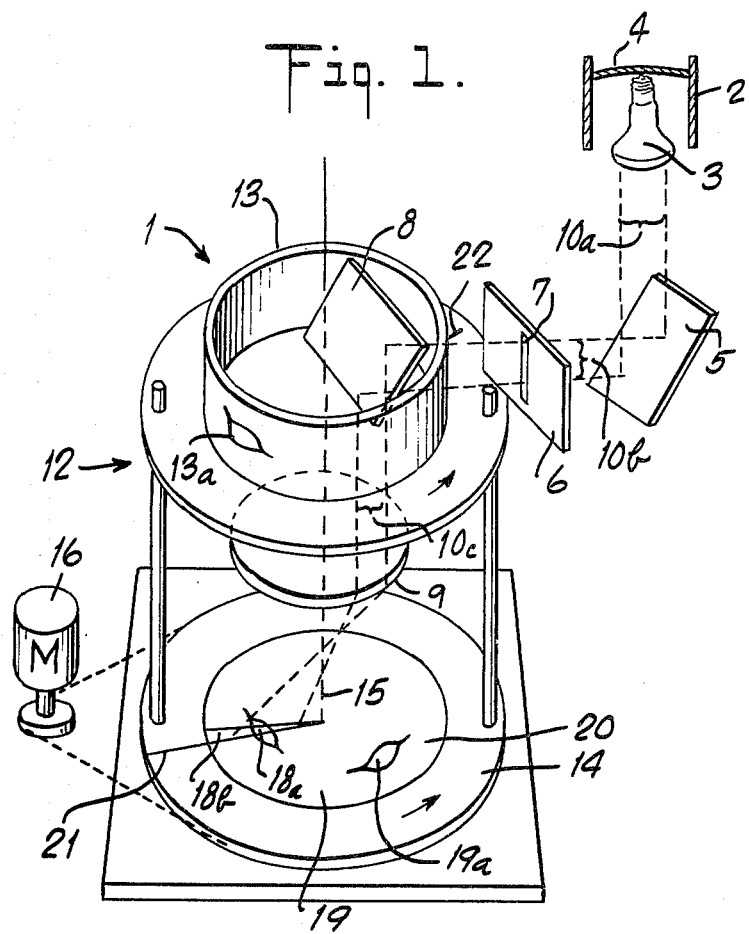
Fig. 1.
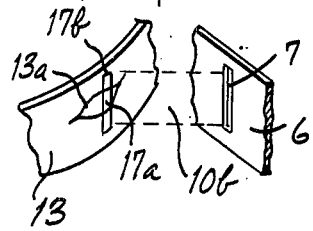
Fig. 1A.
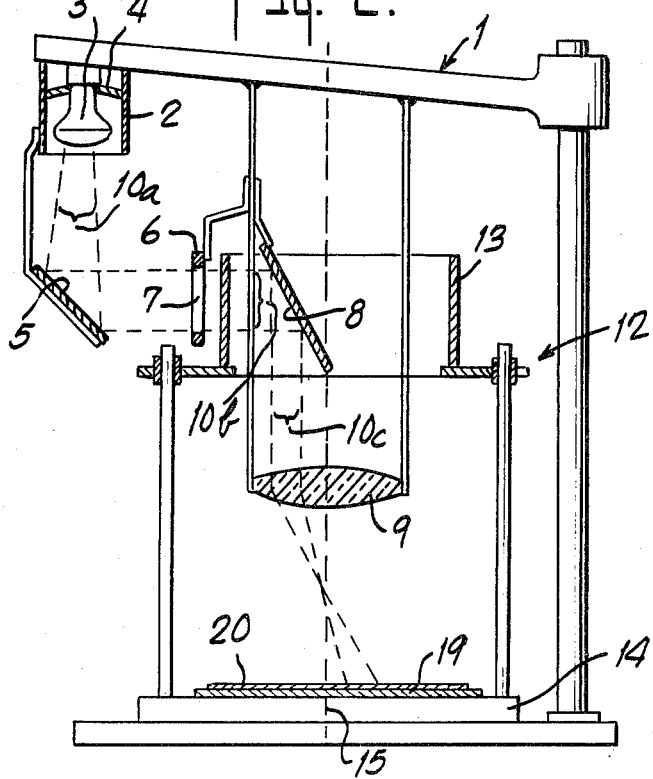
Fig. 2.
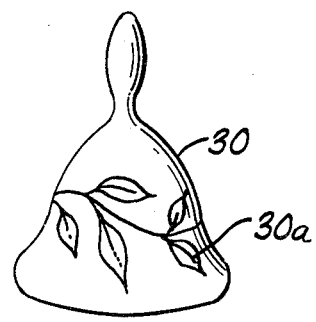
Fig. 3.
Fig. 4.

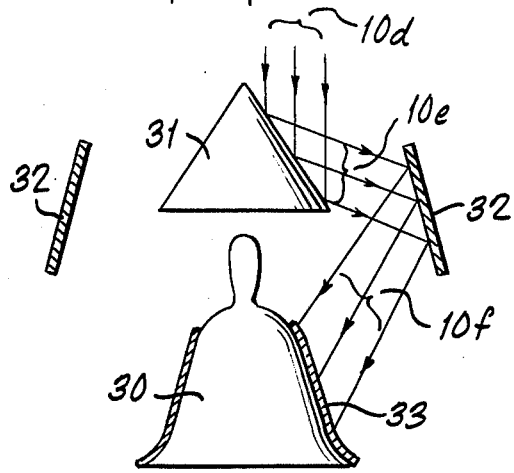
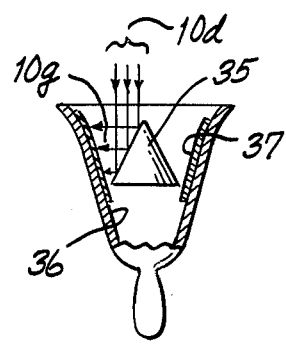
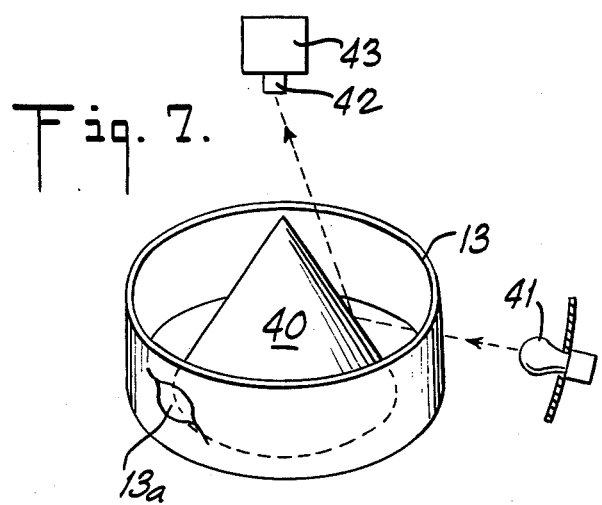
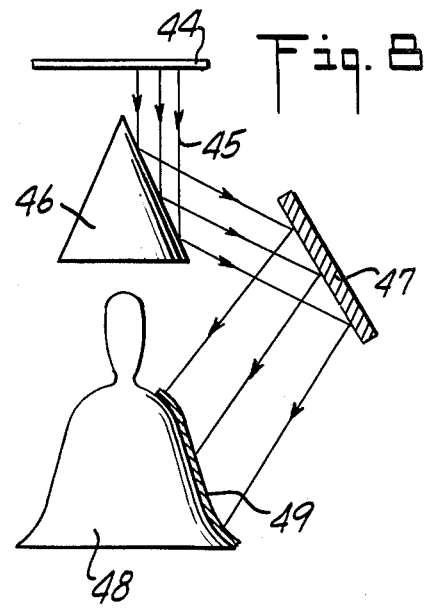
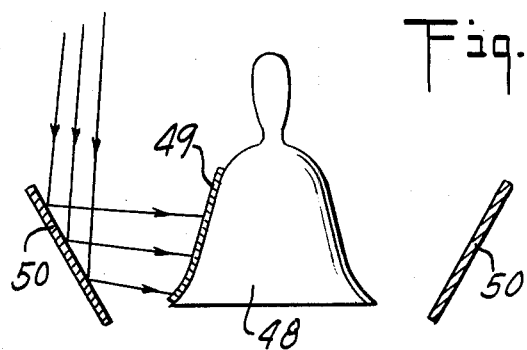

METHOD AND APPARATUS FOR TRANSFERRING A DESIGN TO A FLAT OR ARCUATE SURFACE

CROSS-REFERENCE

This application is a continuation-in-part of applicant's co-pending applications, Ser. No. 757,505, filed Jan. 7, 1977, now U.S. Pat. No. 4,119,484 entitled "Method and Apparatus for Producing a Design on a Flat or Arcuate Surface"; Ser. No. 733,711, filed Oct. 18, 1976, now U.S. Pat. No. 4,101,373, entitled "Method and Apparatus for Producing a Design on a Flat Surface Adapted to be Formed into an Arcuate Surface"; and Ser. No. 729,764, filed Oct. 5, 1976, now U.S. Pat. No. 4,102,734, entitled "Method and Apparatus for Producing a Design on an Arcuate Surface", all of which are hereby incorporated by reference.

BACKGROUND OF THE INVENTION

The present invention relates to the production of a design on a flat, arcuate or irregular, non-flat surface. More particularly, the invention relates to method and apparatus for transferring a flat rectangular design onto an image surface, either in a foreshortened circular form on a flat image surface for subsequent formation into an arcuate surface bearing the design in relatively undistorted form, or directly on an arcuate surface.

Multi-colored metal designs have been produced on flat surfaces using conventional photographic masking techniques to allow successive selective etching and/or metal deposition corresponding to each color effected. Such surfaces can then be curved or pressed into a desired shape. However, this procedure is limited by the extent to which an arcuate surface can be formed without excessive distortion of the design, which would usually be in a flat rectangular-coordinate form.

It also has been proposed to transfer a design from a flat transparency directly onto an arcuate surface. However, no prior procedure has accomplished this transference without substantial distortion of the design.

It is known to applicant to produce a design on a flat or arcuate surface by use of a projection technique as in applicant's co-pending application, Ser. No. 757,505, filed Jan. 7, 1977, entitled "Method and Apparatus for Producing a Design on a Flat or Arcuate Surface." That method and apparatus permit production of a design on a surface without distortion and achieve a similar result to that intended herein.

It is also known to applicant to transfer a flat design directly to an arcuate surface by use of a projection and rotation technique, as in applicant's co-pending application, Ser. No. 729,764, filed Oct. 5, 1976, now U.S. Pat. No. 4,102,734, entitled "Method and Apparatus for Producing a Design on an Arcuate Surface." It is further known to applicant to transfer a flat design to a flat surface in foreshortened, polar-coordinate form, and then to form the flat surface into an arcuate surface without any apparent distortion, as in applicant's co-pending application, Ser. No. 733,711, filed Oct. 18, 1976, now U.S. Pat. No. 4,101,373, entitled "Method and Apparatus for Producing a Design on a Flat Surface Adapted to be Formed into an Arcuate Surface." These two methods and apparatus utilize synchronized motion of the object and the image surface. The present method and apparatus is an alternative which does not require special means for synchronization of movement of the transparency and image surface. Applicant's other methods produce a similar result to that intended herein.

SUMMARY OF THE INVENTION

It is a primary object of this invention to provide a method of reproducing a flat rectangular-coordinate design on an arcuate surface with minimum distortion. It is another object of the invention to provide a method of transferring a design from a flat rectangular-coordinate form to a flat polar-coordinate form, or alternatively to a radially disposed rectangular-coordinate design on an arcuate surface. It is still another object of this invention to provide a useful means for producing an etched and/or multi-finished foreshortened circular design in a readily repeatable manner as for a production run on each of many flat pieces for subsequent formation into arcuate shapes. A further object is to provide apparatus for readily producing designs conforming to differently shaped surfaces and/or in different proportions, as for a set, or prototypes, or custom or sample items. It is a further object to provide a method for the successive application of a resist-coat on a flat or arcuate surface corresponding to the finish-separated patterns of a multi-finished design so as to allow successive corresponding etching and/or superimposition of different metals or other coatings by conventional means to reproduce such a design on such surface directly or for subsequent formation into an arcuate surface bearing such design without apparent distortion.

The method of the present invention provides a means to generate design patterns either on a set of registerable masks or directly onto a formable flat surface or preformed arcuate surface. In one form of the invention, transference is achieved by projection of narrow transverse images of the design pattern onto corresponding narrow radial portions or segments of a flat mask or surface. Light is passed through a slit and thence through a transparency bearing the original design in rectangular-coordinate form and formed into a cylinder. The light is then redirected by a flat, inclined mirror through a lens such that the narrow transverse images of the design are projected upon and received in polar-coordinate form by corresponding narrow radial portions of a photosensitized flat surface. The flat surface is then processed and formed into an arcuate shape bearing the design in relatively undistorted form.

In another form of the invention, the redirected light is again redirected by means of conical mirrors such that the design is projected directly upon and received by corresponding transverse portions of an arcuate surface. In another embodiment of the method of the invention, the redirected light is projected onto a photosensitized film which is processed into a transparency bearing the design in polar-coordinate form. This transparency is then projected toward and received either by an arcuate image surface and is restored to substantially rectangular-coordinate disposition, or by a flat image surface which is formed into the arcuate shape. In another preferred form this transparency is produced by redirecting the light from the cylindrical design surface to a right-angle conical mirror concentric with such design surface such that the redirected light is focused upon said flat film surface, which is photosensitive, in a polar-coordinate configuration.

In the apparatus of the invention, a design in a flat rectangular form, i.e. rectangular-coordinate form, and created upon a transparency is formed into a cylindrical shape and held upon a supporting surface. Light is passed through the slit and thereafter through the transparency such that narrow transverse images of the design are projected. A flat, inclined mirror, aligned with the slit, redirects the narrow rectangular beam of light through a projection lens. Either the mirror and slit are fixed and the cylindrical transparency is rotated together with the flat image surface, or the mirror and slit are rotated and the transparency and the flat image surface are stationary. The flat surface is maintained perpendicular to the projected transverse areas and has its center coincident with the axis of the cylindrical transparency. If the cylindrical transparency and flat image surface are rotated in tandem, radial image segments of the projected design will be received in rotational sequence by corresponding narrow radial areas of the flat surface in foreshortened circular form, i.e. polar-coordinate form. After exposure, the coating is fixed and the unexposed portion dissolved. The latter area of the surface is then etched, plated or otherwise processed. Finally, the flat surface is formed into the arcuate shape.

If the image surface is a mask, it can be used for repetitive transference of the polar-coordinate design onto other flat surfaces.

If the image surface is an arcuate shape, a mirrored surface is placed between the projection lens and the arcuate surface to redirect the light so as to focus upon the arcuate surface.

In another embodiment of the apparatus of the invention, the redirected light is projected onto a photosensitized film, which may be contained in a camera. The film is exposed and processed into a second transparency on which the design is in polar-coordinate form.

DESCRIPTION OF DRAWINGS

FIG. 1 is a perspective view of apparatus for projecting narrow transverse images of a rectangular design pattern in rotational sequence onto corresponding narrow radial portions of a flat image surface in accordance with the invention.

FIG. 1A is a view of a portion of the apparatus shown in FIG. 1.

FIG. 2 is a sectional, elevational view of the apparatus shown in FIG. 1.

FIG. 3 is a sectional, elevational view of apparatus for exposing a photosensitized flat surface to circular patterned masks useful in the method of the invention.

FIG. 4 is a perspective view of an arcuate surface formed in accordance with the method of the invention.

FIG. 5 is a sectional, elevational view of apparatus for redirecting the design pattern projection onto an outside arcuate surface.

FIG. 6 is a sectional, elevational view of apparatus for redirecting the design pattern projection onto an inside arcuate surface.

FIG. 7 is a perspective view of apparatus for projecting a design pattern onto a flat photosensitized image surface in accordance with an alternative embodiment of the invention.

FIG. 8 is a sectional, elevational view of apparatus for redirecting the design pattern projection onto an outside arcuate surface in accordance with the alternative embodiment of the invention shown in FIG. 7.

FIG. 9 is a sectional, elevational view of apparatus for redirecting the design pattern projection onto an outside arcuate surface in accordance with a further embodiment of the invention shown in FIG. 7.

DETAILED DESCRIPTION

Generally, photoetching or selective photoplating of a surface is accomplished by applying a photoresist coating to the surface to be processed and then light-exposing that portion not to be etched or plated through a corresponding transparency or mask held in close contact to the surface. The light-exposed resist is then fixed and the unexposed resist is dissolved. When the surface is immersed in an etching or plating solution, processing will take effect selectively only where the resist has been removed, thus producing a desired pattern. This process is readily accomplished where the surface to be processed is flat and close contact with a flat transparency or mask can be established. However, in the case of a non-cylindrical arcuate form, it is difficult to conform the desired design image to any extensive area of the arcuate surface by the above-described conventional techniques.

Conformance of the design image from a conventional flat transparency or mask to an arcuate surface is accomplished in accordance with one form of the present invention by progressively and successively projecting narrow transverse images of a design from the transparency or mask. The transverse images are received in foreshortened form by corresponding narrow radial segments of a photoresist-coated or photosensitized flat surface. Subsequent processing produces a circularly distorted pattern on a flat surface, which is suitable for forming into a desired arcuate surface bearing the design without apparent distortion. This embodiment of the invention also contemplates projecting the narrow transverse images directly upon a photoresist-coated arcuate surface.

Referring to FIGS. 1 and 2 of the drawings, a projector 1 comprises a light box 2 provided with a suitable light source 3. A parallel ray mirrored surface 4 is within the light box 2. An inclined flat mirrored surface 5 is positioned beneath the light box 2. A light mask 6 containing an adjustable slit opening 7 is positioned at an angle to the mirrored surface 5. A second inclined flat mirrored surface 8 is located on the opposite side of the light mask 6 from the first mirrored surface 5 and is substantially parallel thereto. An adjustable focusing lens 9 is placed beneath the mirrored surface 8 and is substantially perpendicular to the light mask 6.

Light projected in a column 10a from the light source 3 is directed as follows through the projector 1. First, the mirror 5 reflects the light along path 10b through the slit 7 to the mirror 8. Then, the mirror 8 redirects the light along path 10c toward the lens 9, which focuses the light. The lens 9 may be a double convex lens or any other suitable single- or multi-element focusing lens.

A support assembly 12, which is adjustable in height, is adapted to hold a flat, rectangular transparency or mask 13 which has been formed into a cylindrical shape having a design pattern 13a thereon. The support assembly 12 rests upon a rotatable turntable 14 whose axis 15 is coincident with the axis of the cylindrical transparency 13. A motor 16 is adapted to drive the turntable 14 through suitable drive means, e.g. a belt.

The transparency 13 is adapted to be positioned on the support assembly 12 directly in the path of radially inwardly directed light 10b. As shown in FIG. 1A, light and dark transverse images 17a corresponding to the design pattern 13a at narrow transverse areas 17b of the transparency 13 are projectable in the direction of the light beam path 10b. As used herein, the term "narrow transverse area" means one of the many portions of the transparency 13 which is exposed to the light similarly to the well-known projection technique used for slides or photographic transparencies.

In one embodiment of the invention, the projected narrow transverse images 17a are displayed upon and received as narrow radial images 18a by corresponding narrow radial areas or segments 18b of a flat, substantially circular image surface 19. The image surface 19 is located on the turntable 14 and is disposed perpendicular to the light beam axis 15. The flat, circular image surface 19 is provided with a photoresist coating 20. Portions of the coating 20 are adapted to be exposed to the narrow radial images 18a. When the entire flat, circular surface 19 has been exposed at the narrow radial areas 18b, an entire design pattern 19a is created on the flat, circular image surface 19 corresponding to the flat, rectangular pattern 13a on the transparency or mask 13. However, the rectangular-coordinate design pattern 13a on the transparency 13 has been converted to a foreshortened, polar-coordinate design pattern 19a on the circular, flat image surface 19. The term "foreshortened," as used herein, means that the design pattern 19a is smaller in size than the design pattern 13a because the design pattern 19a is stretched when the flat surface 19 is formed into an arcuate shape, e.g. a bell. The amount of foreshortening is determined empirically and depends upon the arcuate shape to be produced. For example, a cup requires a substantial amount of foreshortening; a shallow dish requires very little. If some distortion is desired or acceptable in the final shape, it may be possible to eliminate the foreshortening.

To transfer a design for subsequent etching and/or plating, the projector 1 is positioned relative to the flat, circular surface 19 for desired image size and amount of foreshortening. The photoresist-coated flat, circular surface 19 is centered on the turntable 14 and positioned relative to the table index mark 21. A first transparency or mask 13 is positioned on the carrier or support 12 relative to the carrier index mark 22 and the lens 9 is focused upon the image surface 19. The drive motor 16 turns the turntable 14 and the image surface 19 thereon. Concurrently, the motor 16 rotates the support assembly 12 with the transparency 13 thereon. The design pattern 13a comprising each of the narrow transverse areas 17b is progressively and successively projected in rotational sequence toward each of the corresponding radial segments 18b of the photoresist-coated image surface 19. The narrow transverse images 17a are received as narrow radial images 18a and are exposed in rotational sequence upon the corresponding narrow radial segments 18b. After complete exposure, the flat, circular surface 19 is removed and processed for etching or plating in the conventional manner, for example, as in U.S. Pat. No. 3,503,815 to Johnson. To process a successive pattern, a new coating of photoresist 20 is applied to the flat, circular surface 19 and the above-described cycle is repeated. A desired etched and/or multi-finished design is thereby produced on the flat, circular image surface 19.

The flat, circular surface 19 may be a mask, stencil or transparency. As a transparency, the image surface 19 may be a film contained within a camera. The camera would include the equivalent of the lens 9 and the lens shutter would be held open. The film will be exposed to the design in foreshortened, polar-coordinate form. After processing, the film can be used as a second transparency for subsequent imaging.

As a mask or transparency, the image surface 19 may be used directly in mass producing a series of flat, circular surfaces suitable for forming into the desired arcuate articles. Also, the flat surface 19 need not be circular, although that configuration is useful for creating certain arcuate shapes, e.g. a bell.

For preparing a larger number (or more than several) of the same-shaped surfaces with the same designs, an expeditious mass-production method desirably is employed. The modification permits the use of a simple light source and the simultaneous exposure of all areas of a flat, circular surface once the mask has been formed. As shown in FIG. 3, a flat, circular transparency or mask 25 is produced by the method and apparatus shown in FIGS. 1 and 2. This mask 25 is placed over a matching flat image surface 19 onto which a photosensitized coating 20 has been deposited. The transparency or mask 25 and the surface 19 are then exposed to a light source 26 and developed and fixed by conventional photographic means to produce an image on the surface. Transparency or mask sets may be used to produce successive, registered, circular design patterns on the flat, formable surface. The flat, circular surface is processed in the conventional manner by successively photoresist-coating, contact exposing, fixing or developing, and etching or plating as required. It is thereafter formed, as in FIG. 4, into the desired arcuate shape 30 bearing the desired design 30a without apparent distortion.

Masks produced in this way may also be etched through to form stencils for use in coating the arcuate surface. After positioning a stencil 25 on the flat surface 19, either a final or a resist coating 20 is applied by spray, brush or other deposition means. As a resist coat, subsequent processing for etching and/or plating would be carried out in the conventional manner.

An alternative form of the invention contemplates the transference of the design directly to an arcuate surface. This technique is useful when preparing a large number of objects having an unusual shape. FIG. 5 shows a method of transferring a design pattern to an outside arcuate surface and is intended to be used in conjunction with the apparatus and method of FIGS. 1 and 2, or with the projection of a radially disposed, flat transparency such as would be produced therefrom. An outside mirrored conical surface 31 and an inside mirrored conical surface 32 are interposed between the lens 9 and an arcuate surface 30 bearing a photoresist coating 33. The focused light following the path 10d through the lens 9 strikes the mirrored surface 31 and is directed along path 10e toward the mirrored surface 32, which redirects the light along path 10f toward the photosensitized arcuate image surface 30. The mirrored surface 31 partially restores the design image to substantially rectangular-coordinate form and to right-side-up position. The angles and positions of the mirrored surfaces depend upon the arcuate shape to be produced and the size thereof so that the light strikes the arcuate surface substantially perpendicular thereto. Thus, narrow transverse images 17a projected from the transparency 13 are received by and exposed in rotational sequence upon the photoresist-coated arcuate surface 30, or all at once in the case of a projected, flat, radially disposed image.

FIG. 6 shows a similar method for transferring the design onto an inside arcuate surface. An outside mirrored conical surface 35, which partially restores the design image to substantially rectangular-coordinate form, is placed between the lens 9 and an inside arcuate surface 36 having a photoresist coating 37. Focused light following the path 10d through the lens 9 is redirected by the mirrored surface 35 along path 10g toward the photosensitized arcuate image surface 36. The narrow light and dark images 17a projected from the transparency 13 are exposed in rotational sequence upon the photoresist-coated inside arcuate surface 36, or all at once in the case of a projected, flat, radially disposed image.

Another preferred embodiment of the invention is illustrated in FIG. 7. In this embodiment, a conical mirrored surface 40 functions as an equivalent to the rotatable inclined mirror 8 in the FIGS. 1 and 2 embodiment. Light is projected from a suitable light source or sources 41 and is directed through a rectangular transparency 13, or reflected from a rectangular surface 13, which has been formed into a cylindrical shape having the rectangular design pattern 13a thereon. Light and dark images 17a corresponding to the design pattern 13a are projectable in the direction of the light path. The outside conical mirrored surface 40 is located on the opposite side of the transparency 13 from the light source 41 such that it redirects the light passing through the transparency 13 substantially perpendicular to its initial direction. The light reflected by the conical mirrored surface 40 is directed toward and through a lens shutter 42 of a simple camera 43 positioned along the axis of the conical mirror. The lens shutter 42 is held open to receive the entire exposure. A conventional, photosensitized film within the camera thereupon is exposed to the light and dark images 17a. However, the images received by the film are in foreshortened, polar-coordinate form. The film is fixed and processed in the conventional manner. It should be noted that a single light source 41 can be used together with a light mask 6 and slit 7 (as in FIG. 1) and either the light source 41 or the transparency 13 rotated with respect to the other to project all narrow transverse images 17a toward the camera 43. Alternatively, multiple light sources 41 or a radial light source can be used to project the entire transparency simultaneously without rotation of either the light sources or the transparency.

The processed film created by the method of FIG. 7 may then be used in production of designs, as is, for example, the transparency 25 (FIG. 3). The processed film also may be used as a second transparency (or set of transparencies) to transfer the design directly to an arcuate or flat surface.

In FIG. 8, there is shown method and apparatus for transferring the design from the processed film or transparency to an arcuate surface. The image on film 44 is illuminated such that light and dark images in polar-coordinate form are reflected simultaneously along a light path 45. An outside conical mirrored surface 46 is located such that it redirects the light 45 passing through the film or transparency. An inside conical mirrored surface 47 again redirects the focused light toward an arcuate image surface 48, which has been or is provided with a photosensitized resist coating 49. Thus, light and dark images projected from the transparency or film 44 are received directly by the arcuate surface 48 in relatively undistorted, rectangular-coordinate form.

FIG. 9 shows another preferred method for transferring the design from the processed transparency or film 44 directly onto the photosensitized arcuate surface 48. In this embodiment, light and dark images projected from the transparency or film are redirected by an inside mirrored conical surface 50 directly onto the arcuate image surface 48. The method of FIG. 9 eliminates the use of two mirrored conical surfaces, as in the method of FIG. 8. However, to prevent the design from being transferred upside-down, it is necessary to place the first transparency 13 (FIG. 7) upside-down when commencing the method.

The above descriptions are intended to be illustrative of methods for conforming a flat, rectangular-coordinate design pattern to a corresponding polar-coordinate flat design pattern suitable for formation into a desired arcuate surface bearing the design in proper proportion without apparent distortion. Alternatively, the design may be transferred either directly to an arcuate surface or from the polar-coordinate design pattern without apparent distortion. The present invention has substantial use in the production of bowls, bells, jewelry and other decorated items having an arcuate or other irregular surface. The word "arcuate" as used herein is intended to mean irregular, non-flat surfaces of various sizes and shapes. Many other uses of the invention will be apparent to those working in this and related fields.

I claim:

1. A method of transferring a design from a flat rectangular-coordinate form to a flat polar-coordinate form, comprising progressively projecting successive narrow transverse images of the design radially from a flat rectangular transparency formed into a cylindrical shape, and redirecting the path of projection substantially perpendicular to the cylinder radii such that the design images are projected upon and received in sequence in polar-coordinate form by corresponding narrow radial areas of a flat surface.

2. A method according to claim 1 wherein the flat surface is provided with a photosensitive coating.

3. A method according to claim 2 wherein the photosensitive coating is processed after exposure to the projected design.

4. A method according to claim 3 wherein the unexposed portion of the coating is dissolved.

5. A method according to claim 4 wherein the portion of the flat surface upon which the coating has been dissolved is etched or plated.

6. A method according to claim 1 wherein the flat surface is a mask which receives the projected images of the design.

7. A method according to claim 1 wherein the flat surface is a stencil which receives the projected images of the design.

8. A method according to claim 1 wherein the flat surface is a transparency which receives the projected images of the design.

9. A method according to claim 1 further comprising forming the flat surface into an arcuate form bearing the design in relatively undistorted form.

10. A method of producing a polar-coordinate design on a flat image surface from a rectangular-coordinate design, comprising:
(a) forming the design in rectangular-coordinate form upon a flat transparency;
(b) forming the flat transparency into a cylindrical shape;
(c) progressively exposing narrow transverse images of the transparency in rotational sequence to radially directed light;

(d) redirecting the light passing through the transparency perpendicular to the radial light paths whereby corresponding segment images of the design are projected in sequence;

(e) providing the flat image surface with a photosensitive coating;

(f) disposing the flat image surface substantially perpendicular to the redirected light and with its center coincident with the axis of the cylindrical transparency, such that the segment images of the design are exposed in sequence and in polar-coordinate form upon the photosensitized flat image surface; and (g) processing the exposed coating on the flat image surface to selectively produce the design upon the surface.

11. A method according to claim 10 further comprising:

(h) applying the flat image surface bearing the polar-coordinate design to a flat base of substantially the same dimensions;

(i) providing the flat base with a photosensitive coating;

(j) exposing the flat image surface and the flat base to a light source to transfer the design from the flat image surface to the flat base; and (k) processing the exposed coating on the flat base to produce the design thereon.

12. A method according to claim 10 further comprising repeating each of the steps thereof to produce a second design upon the image surface.

13. A method according to claim 10 further comprising forming said flat image surface into an arcuate surface bearing the design restored to a rectangular-coordinate disposition in arcuate form.

14. A method according to claim 11 further comprising forming said flat base into an arcuate surface bearing the design restored to a rectangular-coordinate disposition in arcuate form.

15. A method of transferring a design from a flat form to an image surface, comprising simultaneously projecting image areas of the design in a radial direction from a flat, rectangular-coordinate form design surface formed into a cylindrical shape, redirecting the path of projection substantially perpendicular to the radial path such that the design image areas are directed toward and are exposed upon a flat photosensitive surface in polar-coordinate form, and processing the exposed surface to produce a transformed design thereon.

16. A method according to claim 15 further comprising redirecting the path of projection between the transformed design and the image surface such that the design is projected upon and received by an arcuate image surface in rectangular-coordinate form.

17. A method according to claim 15 further comprising redirecting the path of projection between the transformed design and the image surface such that the design is projected upon and received by a flat image surface.

18. Apparatus for transferring a design from a flat rectangular-coordinate form to a flat polar-coordinate form, comprising projection means for progressively projecting narrow transverse images of the design radially and in rotational sequence from a flat rectangular transparency formed into a cylindrical shape, and reflector means adapted to redirect the path of projection substantially perpendicular to the cylinder radii such that the design images are projected upon and received in polar-coordinate form by corresponding narrow radial areas of a flat image surface.

19. Apparatus for producing a design on an image surface, comprising:

(a) means for projecting design images from a relatively flat transparency reconformed into a cylindrical shape and upon which the design is in rectangularly disposed form, including
    (i) a light source,
    (ii) means for directing the light through a narrow transverse slit and radially through the cylindrical transparency to sequentially project narrow transverse images of the design,
    (iii) a support for holding the cylindrical transparency in the path of the radially directed light, and
    (iv) means for redirecting the light passing radially through the cylindrical transparency into a path perpendicular to the radial light path such that the design images are projected in radial segments;

(b) means for holding the image surface substantially perpendicular to radial segment light paths; and (c) means for concurrently rotating the cylindrical transparency and the image surface relative to the means for redirecting the light such that the radial image segments of the projected design are received in rotational sequence by corresponding narrow radial areas of the image surface and are transferred thereto.

20. Apparatus according to claim 19 wherein the image surface is a flat surface.

21. Apparatus according to claim 19 wherein the image surface is an arcuate surface.

22. Apparatus for transferring a design from a flat, rectangularly disposed design surface to an image surface, comprising:

(a) means for holding the flat design surface in a cylindrical shape;

(b) a light source adapted to direct light radially from the cylindrical design surface and to project simultaneously image areas of the design;

(c) means for redirecting the light and the projected design image areas substantially perpendicular to the radial light path;

(d) means including a flat photosensitive surface upon which the projected design image areas are exposed;

(e) means for processing the exposed surface to produce a transparency bearing the design thereon; and (f) means for projecting the design from the last-mentioned transparency toward the image surface.

23. Apparatus according to claim 22 wherein the last-mentioned transparency bears the design thereon in polar-coordinate form and the image surface is an arcuate surface.

24. Apparatus according to claim 23 further comprising means interposed between the last-mentioned transparency and the arcuate image surface such that the design is projected upon and received by the arcuate image surface in substantially rectangular-coordinate form.

25. Apparatus according to claim 22 wherein the last-mentioned transparency bears the design thereon in polar-coordinate form and the image surface is a flat surface.

* * * * *